(12) United States Patent
Inoue et al.

(10) Patent No.: US 8,223,247 B2
(45) Date of Patent: Jul. 17, 2012

(54) METHOD FOR CALCULATING SHIFT AMOUNT OF IMAGE PICKUP ELEMENT AND IMAGE PICKUP ELEMENT

(75) Inventors: Tadao Inoue, Kawasaki (JP); Hiroshi Daiku, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 627 days.

(21) Appl. No.: 12/364,915

(22) Filed: Feb. 3, 2009

(65) Prior Publication Data

US 2009/0207267 A1 Aug. 20, 2009

(30) Foreign Application Priority Data

Feb. 15, 2008 (JP) .................................. 2008-35356

(51) Int. Cl.
*H04N 5/225* (2006.01)
*H04N 9/04* (2006.01)
(52) U.S. Cl. ........................................ 348/340; 348/273
(58) Field of Classification Search .................. 348/340, 348/273, E05.031
See application file for complete search history.

(56) References Cited

U.S. PATENT DOCUMENTS

| | | | |
|---|---|---|---|
| 4,575,626 A * | 3/1986 | Oinoue et al. | 250/201.8 |
| 6,663,784 B1 | 12/2003 | Kummer et al. | |
| 6,734,890 B2 * | 5/2004 | Takeuchi et al. | 347/244 |
| 7,126,099 B2 * | 10/2006 | Hsu et al. | 250/208.1 |
| 2001/0039061 A1 | 11/2001 | Suzuki et al. | |
| 2005/0068433 A1 * | 3/2005 | Aotsuka | 348/272 |
| 2005/0190284 A1 | 9/2005 | Wakano et al. | |
| 2006/0016961 A1 * | 1/2006 | Oda | 250/208.1 |
| 2006/0027732 A1 | 2/2006 | Ahn | |
| 2006/0187553 A1 | 8/2006 | Tanaka et al. | |
| 2006/0284052 A1 | 12/2006 | Toshikiyo et al. | |
| 2007/0146531 A1 * | 6/2007 | Toshikiyo | 348/340 |
| 2007/0222885 A1 | 9/2007 | Katsuno | |
| 2009/0080321 A1 * | 3/2009 | Kimura et al. | 369/112.23 |

FOREIGN PATENT DOCUMENTS

| | | |
|---|---|---|
| JP | 05-328233 A | 12/1993 |
| JP | 2001-160973 | 6/2001 |
| JP | 2002-538972 | 11/2002 |
| JP | 2003-18476 A | 1/2003 |
| JP | 2005-249846 | 9/2005 |
| JP | 2006-237150 | 9/2006 |
| JP | 2006-344880 | 12/2006 |
| JP | 2006-351972 | 12/2006 |
| JP | 2007-288164 | 11/2007 |
| KR | 10-2006-0009965 A | 2/2006 |

OTHER PUBLICATIONS

JP Office Action dated May 15, 2012, 6 pages.

* cited by examiner

*Primary Examiner* — Hung Lam
(74) *Attorney, Agent, or Firm* — Arent Fox LLP

(57) ABSTRACT

A method for calculating a shift amount of a microlens from a position of a light receiving element arranged in a pixel of an image pickup element is provided. The microlens collects incident light from an image pickup lens. The method comprises: acquiring an incident angle characteristic value indicating a relation between an arranged position of the pixel and an incident angle of the incident light to the pixel; calculating a sampled shift amount of the microlens from the position of the light receiving element corresponding the incident angle characteristic value based on light collection efficiency of the incident light; approximating the sampled shift amount by a second or higher order function to calculate a shift amount characteristic function indicating a relation between the arranged position and the shift amount; and calculating the shift amount of the pixel using the shift amount characteristic function.

16 Claims, 16 Drawing Sheets

OTHER THAN CENTER:
ML IS SHIFTED IN X-DIRECTION AND Y- DIRECTION

CENTER OF SCREEN: SHIFT AMOUNT = 0

LENS A: HAVING SUBSTANTIALLY LINEAR CRA CHARACTERISTIC

LENS B: HAVING NONLINEAR CRA CHARACTERISTIC

LENS A: HAVING SUBSTANTIALLY LINEAR CRA CHARACTERISTIC

LENS B: HAVING NONLINEAR CRA CHARACTERISTIC

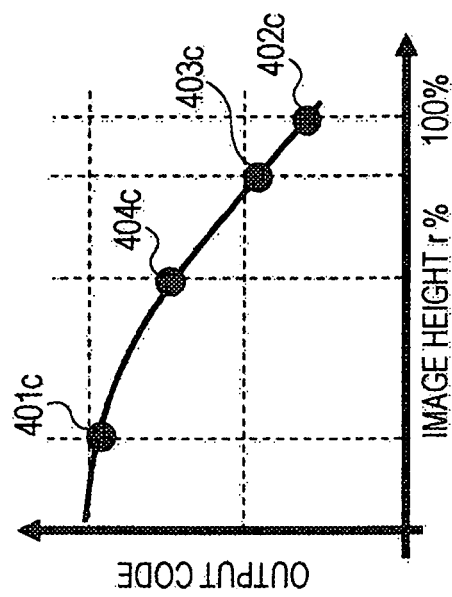
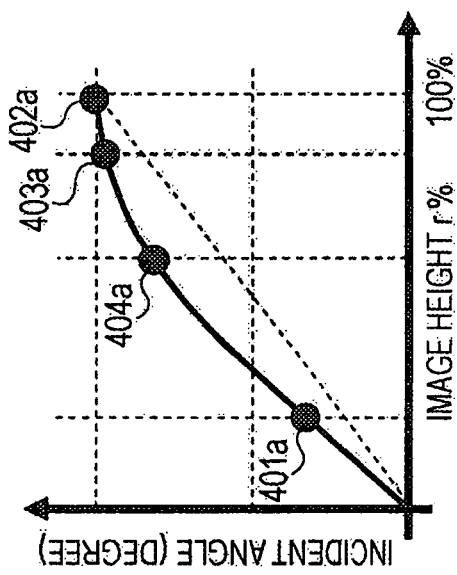
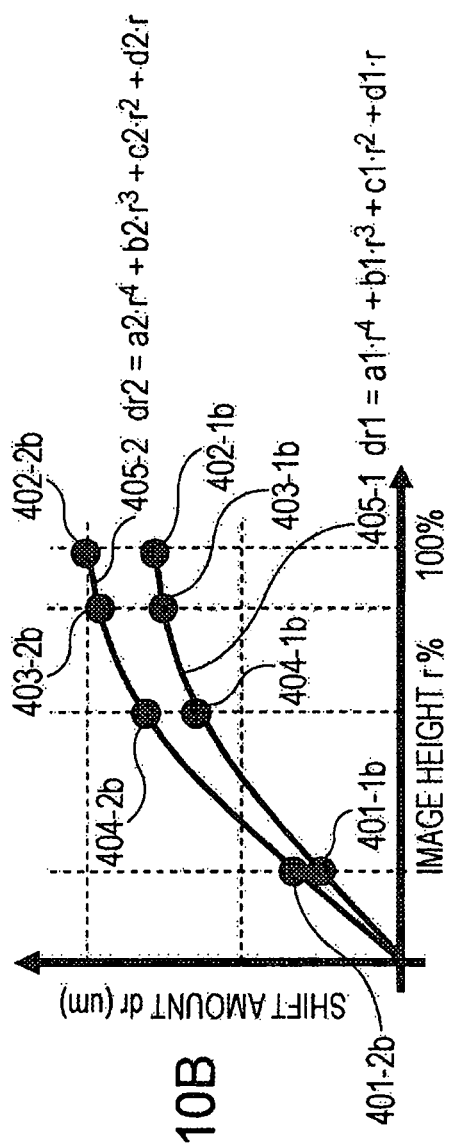
FIG. 10A
FIG. 10B
FIG. 10C

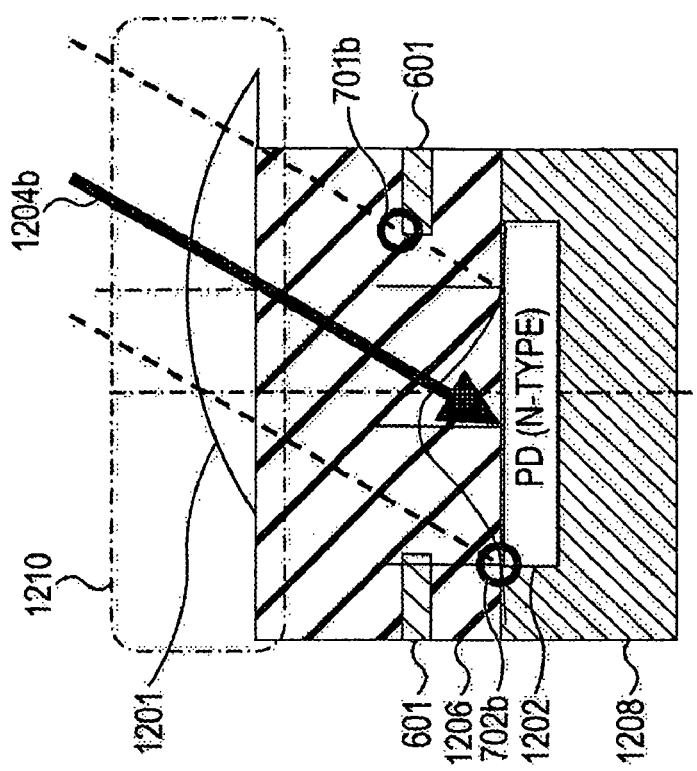

METHOD FOR CALCULATING SHIFT AMOUNT OF IMAGE PICKUP ELEMENT AND IMAGE PICKUP ELEMENT

CROSS-REFERENCE TO RELATED APPLICATIONS

This application claims the benefit of priority from Japanese Patent Application No. 2008-35356 filed on Feb. 15, 2008, the entire contents of which are incorporated herein by reference.

BACKGROUND OF THE INVENTION

1. Field of the Invention

The embodiments discussed herein are directed to solid-state image pickup elements (image sensors) used in camera modules of digital cameras and mobile phones.

2. Description of the Related Art

With miniaturization of camera modules used in digital cameras and camera-equipped mobile phones, miniaturization, cost reduction, a higher image quality, a wider angle of view, and reduction in an incident angle at edges of a screen of a solid-state image pickup element are desired for image pickup lenses. Japanese Laid-open Patent Publication Nos. 2003-18476 and H05-328233 disclose solid-state image pickup elements.

SUMMARY

Aspects of the embodiments include a method for calculating a shift amount of a microlens from a position of a light receiving element arranged in a pixel of an image pickup element is provided. The microlens collects incident light from an image pickup lens onto the light receiving element. Aspects of the method may include acquiring an incident angle characteristic value indicating a relation between an arranged position of the pixel and an incident angle of the incident light to the pixel; calculating a sampled shift amount of the microlens from the position of the light receiving element corresponding the incident angle characteristic value based on light collection efficiency of the incident light; approximating the sampled shift amount by a second or higher order function to calculate a shift amount characteristic function indicating a relation between the arranged position and the shift amount; and calculating the shift amount of the pixel using the shift amount characteristic function.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

FIG. 10 shows characteristics according to a third embodiment;

FIG. 13 shows aspects of a fourth embodiment;

DESCRIPTION OF THE PREFERRED EMBODIMENTS

In a solid-state image pickup element, such as a CMOS (complementary metal oxide semiconductor) sensor and a CCD (charge coupled device), light coming through an image pickup lens 1205 is led to light receiving portions 1202, such as photo diodes (PD), constituting pixels arranged in a two-dimensional array. A pixel includes transistors and interconnection patterns in addition to the light receiving portion 1202. Accordingly, a width of an opening of the light receiving portion 1202 is narrower than a pitch between pixels and only part of the light coming through the image pickup lens 1205 is led to the light receiving portion 1202, thereby sensitivity of the solid-state image pickup element decreases.

Figure 1B:
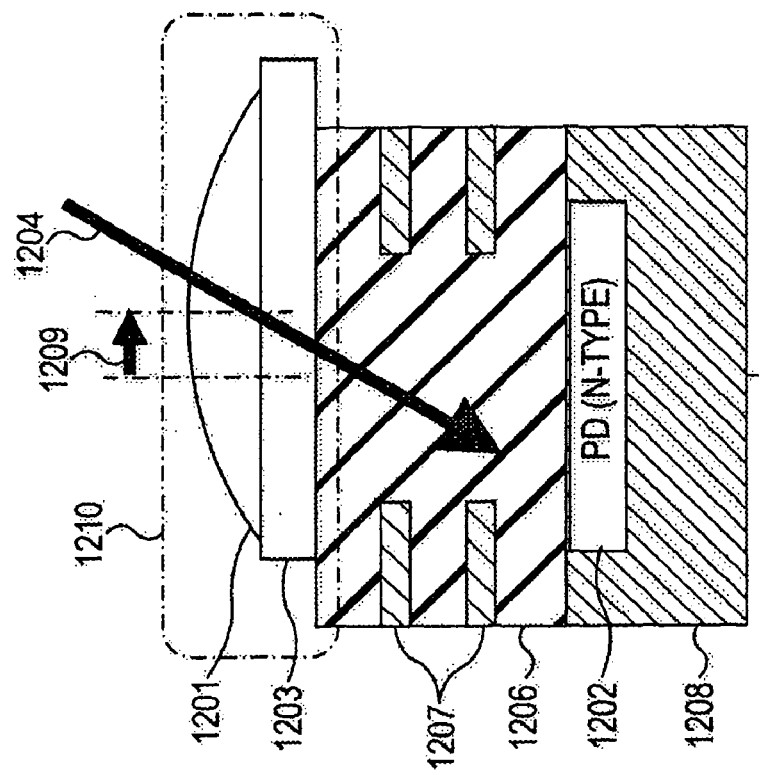
FIG. 1 shows sectional views of a solid-state image pickup element.
Figure 1A:
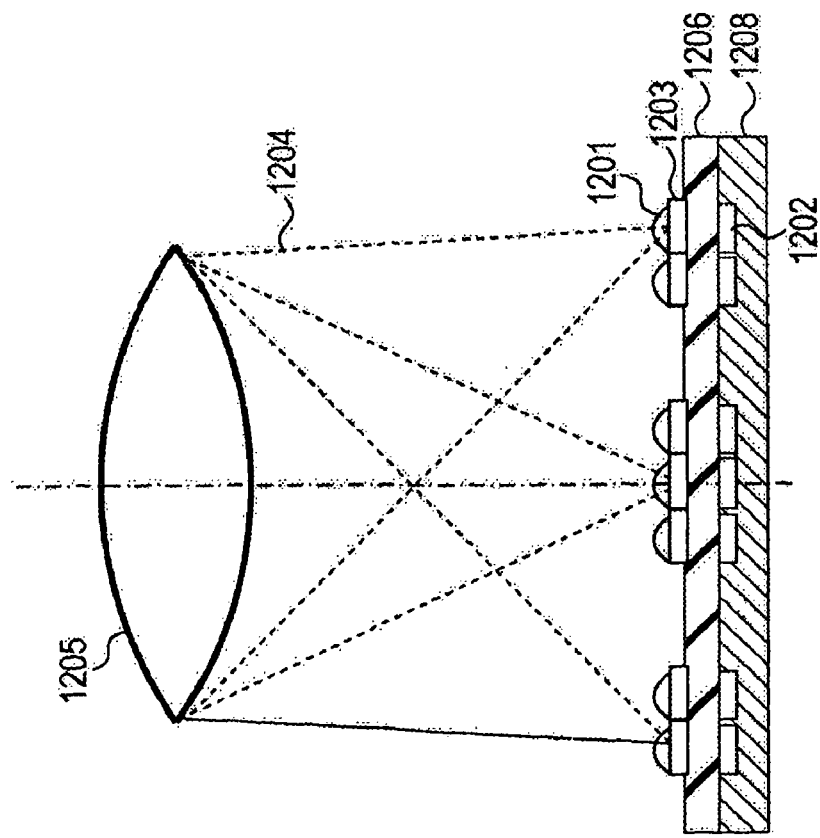

FIGS. 1A and 1B show sectional views of a solid-state image pickup element. As shown in FIGS. 1A and 1B, to prevent the decrease in the sensitivity, the solid-state image pickup element includes a microlens (ML) 1201 as part of a light collecting portion 1210. The light is collected so that a wide range of the light reaches the light receiving portion 1202 arranged on a silicon (Si) substrate 1208. In a color image pickup element, an on-chip color filter (OCF) 1203 of, for example, red (R), green (G), or blue (B) is arranged above the light receiving portion 1202 as part of the light collecting portion 1210.

When an incident angle with respect to an axis vertical to a two-dimensional array plane of the light receiving portion 1202 is equal to substantially 0, incident light 1204 vertically enters the light receiving portion 1202 at a center of a screen. The center of the light receiving portion 1202 matches a center of the light collecting portion 1210, such as the microlens 1201 and the OCF 1203, in a two-dimensional plane.

At regions other than the screen center, such as screen edges, the incident light 1204 reaching the light receiving portion 1202 through the image pickup lens 1205 enters (obliquely) at an incident angle of, for example, 20 to 30 degrees. Accordingly, the incident light is blocked by interconnection layers 1207 arranged in an inter-layer insulating film 1207, which is inserted between the light receiving portion 1202 and the light collecting portion 1210 including the microlens 1201 and the OCF 1203. Thus, the amount of light at a screen peripheral portion decreases extremely compared with that at the screen center, whereby shading characteristics worsen.

Figure 2B:
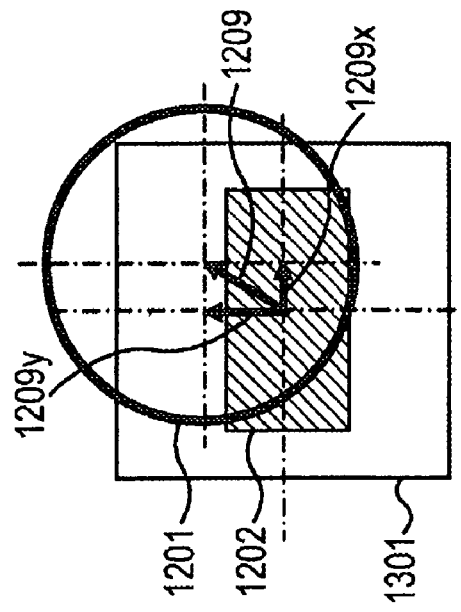
FIG. 2 shows plan views of a solid-state image pickup element.
Figure 2A:
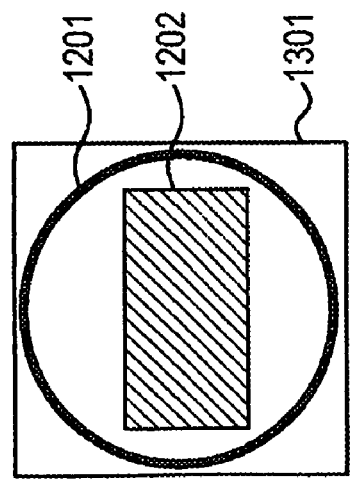
Figure 3:
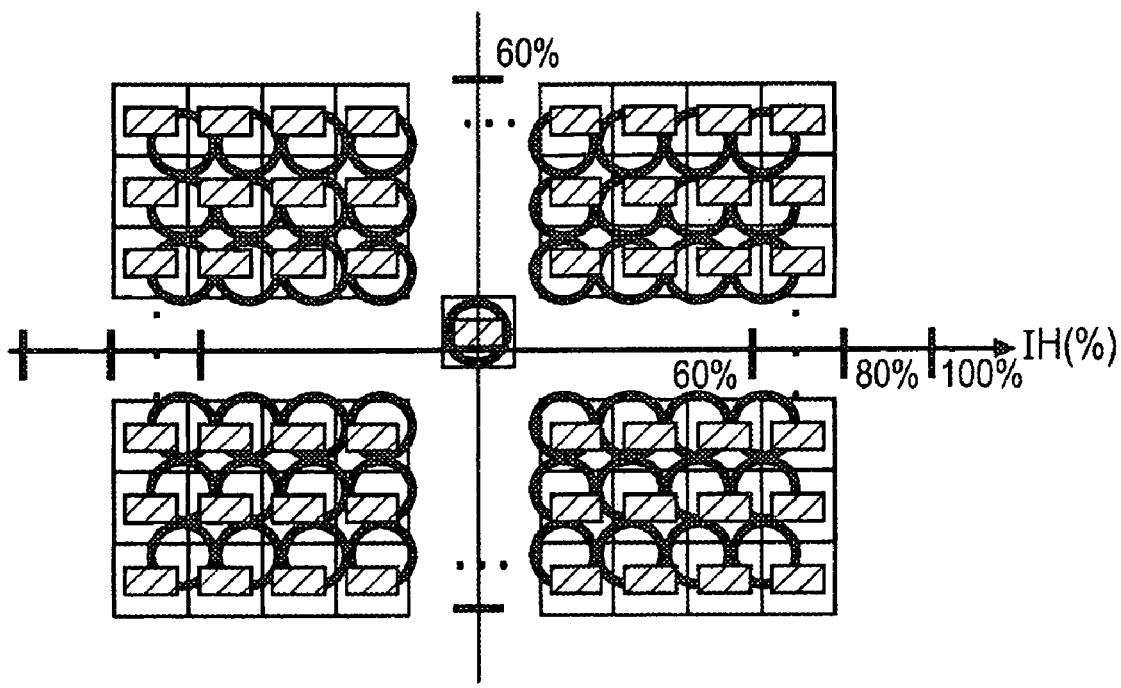
FIG. 3 shows a plan view of a pixel array of a solid-state image pickup element.

FIGS. 2A and 2B show plan views of a solid-state image pickup element. FIG. 3 shows a plan view of a pixel array of a solid-state image pickup element. In regions other than the screen center, the center of the light collecting portion 1210, which includes the microlens 1201 and the OCF 1203 of each pixel 1301, is shifted from the center of the light receiving portion 1202 by a predetermined shift amount 1209 in the two-dimensional plane with respect to the center of the receiving portion 1202. Thus, more obliquely entering incident light 1204 reaches the light receiving portion 1202. Making a pitch of the light collecting portion 1210 smaller than a pitch of the light receiving portion 1202, improves the shading characteristics.

Figure 4:
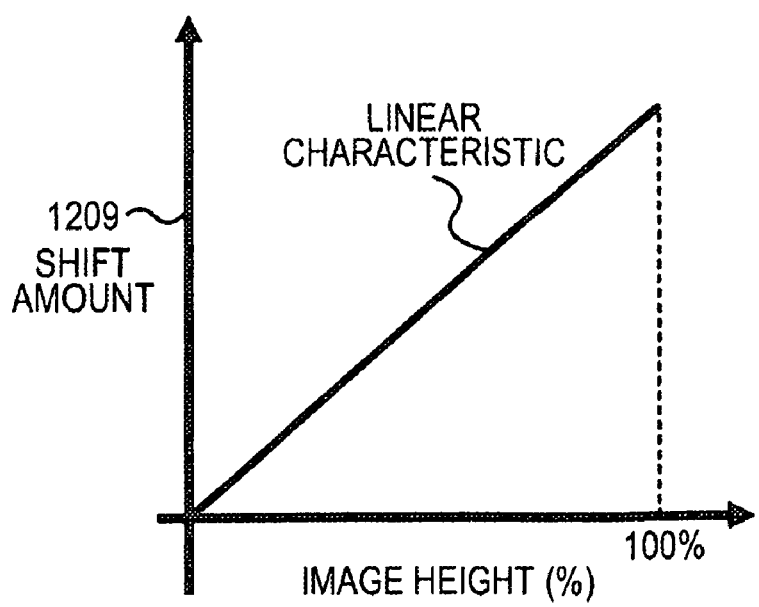
FIG. 4 shows a relation between a shift amount and an image height.

FIG. 4 shows a relation between a shift amount and an image height. The image height indicates a distance between the pixel located at the screen center and each pixel on the two-dimensional array plane that is represented as a percentage when a distance between a pixel located at the screen center and a pixel located at a diagonal end is set equal to 100%. As shown in FIG. 4, the shift amount 1209 linearly increases toward the screen peripheral (in a direction that the image height increases). If a distance from the screen center has an identical value, a shift amount 1209$x$ in a horizontal direction (x-axis direction) and a shift amount 1209$y$ in a vertical direction (y-axis direction) has identical values (see FIG. 2B).

Chief ray angle (CRA) characteristic indicates characteristics of an incident angle of light. The image pickup lens may have CRA characteristic that the incident angle nonlinearly changes toward the screen peripheral from the screen center.

Figure 5A:
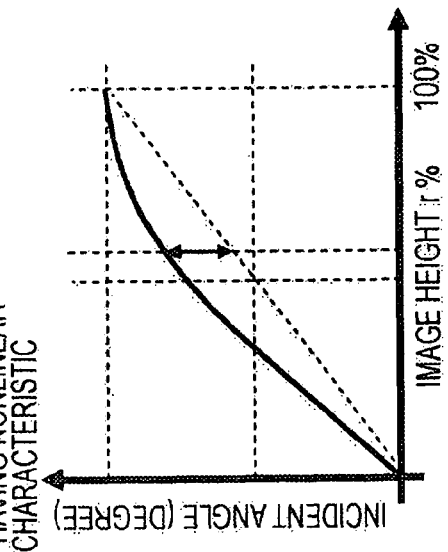
FIG. 5 shows an exemplary CRA characteristics of image pickup lenses.
Figure 5C:
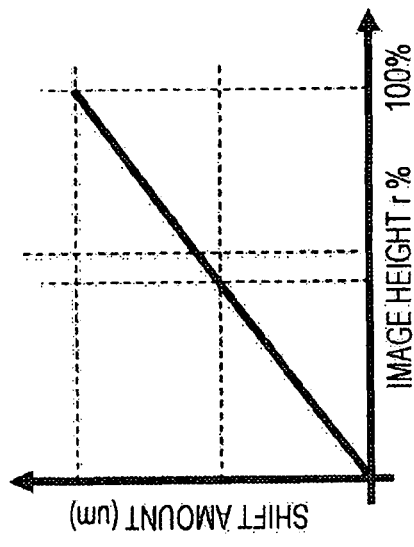
Figure 5B:
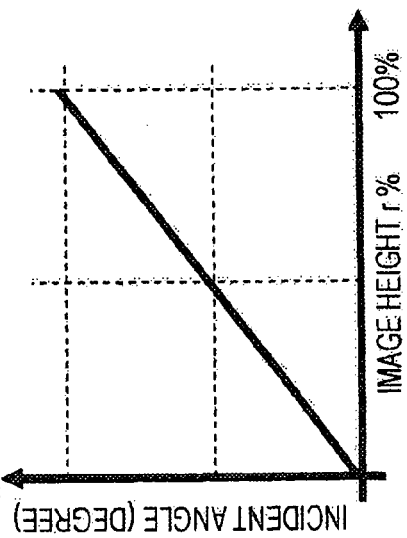
Figure 5D:
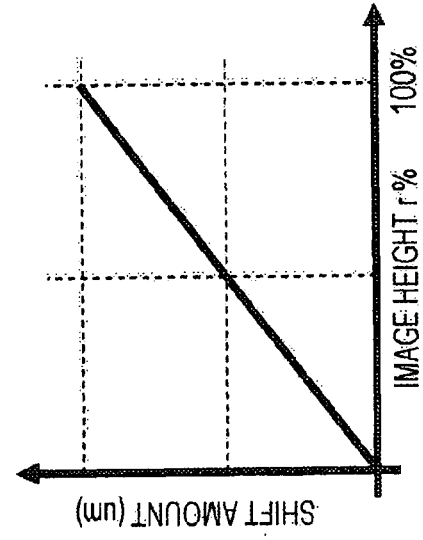
Figure 6A:
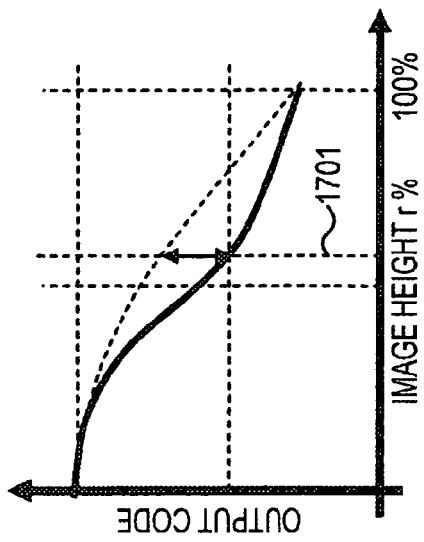
FIG. 6 shows an exemplary CRA characteristics of image pickup lenses.

FIGS. 5A to 5D and FIGS. 6A to 6C show exemplary CRA characteristics of image pickup lenses. FIGS. 5A and 5B and FIG. 6A show a characteristic of an incident angle, a characteristic of a shift amount, and a characteristic of an output code of a lens (lens A) whose CRA characteristics linearly change. On the other hand, FIGS. 5C and 5D and FIGS. 6B and 6C show a characteristic of an incident angle, a characteristic of a shift amount, and a characteristic of an output code of a lens (lens B) whose CRA characteristics nonlinearly change.

Figure 6B:
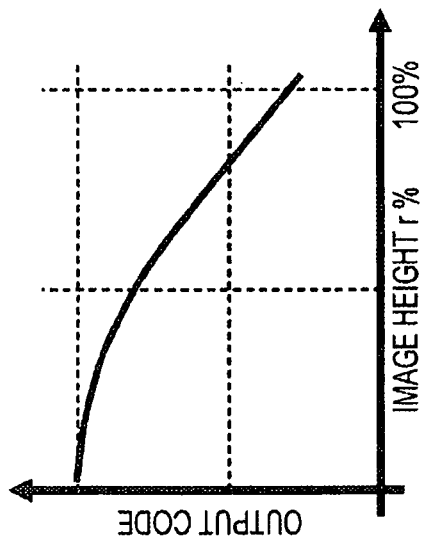

If the shift amount 1209 is set to yield a maximum amount of the incident light reaching the light receiving portion 1202 (see FIGS. 1A and 1B) located at the screen edge (where, the image height is equal to 100%) as shown in FIG. 5D in the case of employing an image pickup lens, such as the lens B, the amount of light decreases (see 1701 of FIG. 6B) substantially at a middle of the screen center and the screen edge. This occurs, for example, at the image height equal to 50%, as shown in FIG. 6B, and the shading characteristics worsen as the graph shows a flexion point.

Figure 6C:
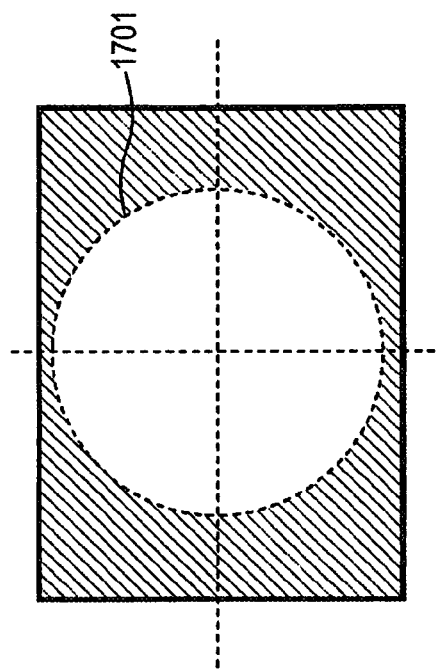

When the shading characteristics are unpreferable, the area of the captured image, which has the decreased shading characteristics, constitutes a concentric circle or a concentric ellipse 1701 as shown in FIG. 6C. Accordingly, the screen center side becomes brighter, whereas an outer side of the screen becomes darker like a shadow. As a result, the image quality worsens.

Figure 7:
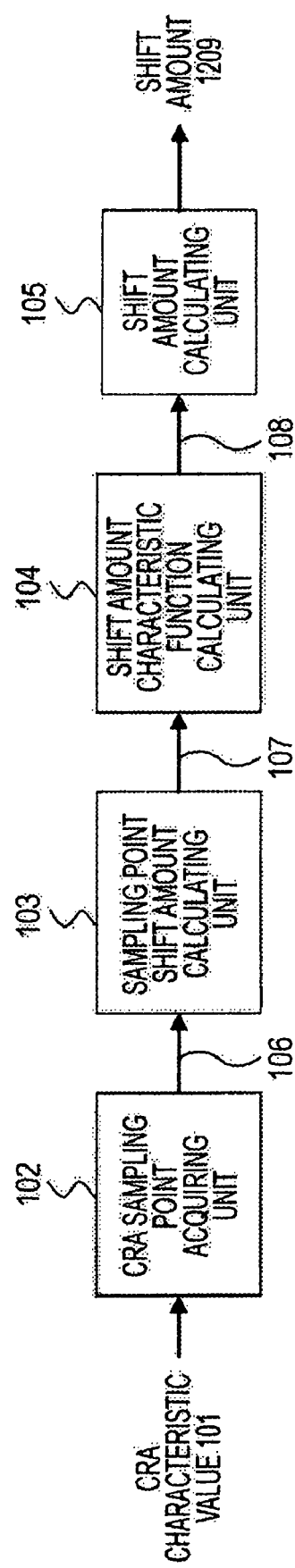
FIG. 7 shows aspects of a first embodiment.

FIG. 7 shows aspects of a first embodiment.

Aspects of the first embodiment may include an apparatus for calculating a shift amount of a light collecting portion of a solid-state image pickup element.

Figure 8C:
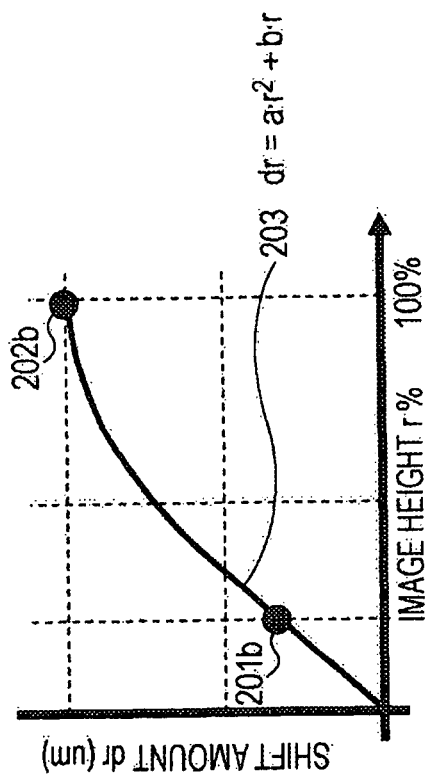
FIG. 8 shows characteristics according to a first embodiment.

The first embodiment has configurations shown in FIGS. 7 to 8C.

Referring to FIG. 7, a CRA sampling point acquiring unit 102 receives CRA characteristic values 101 and acquires 2-5 sampling points 106. The number of the sampling points 106 differs according to the order of a function with which a shift amount characteristic function is approximated. The CRA sampling point acquiring unit 102 includes a display device for displaying the CRA characteristic values 101 to users and a pointing device that allows the users to specify some sampling points 106 from the CRA characteristic values 101 displayed on the display device. The CRA sampling point acquiring unit 102 includes a computer that acquires the sampling points 106 specified by the users and a computer program to be executed by the computer. The computer may include a central processing unit (CPU), a main memory, an external storage device, a display device, a keyboard, and a mouse (pointing device).

Light collection efficiency is a ratio of rays reaching the light receiving portion 1202 to the incident light 1204 to the pixel plane (see FIGS. 1A and 1B). A sampling point shift amount calculating unit 103 determines a sampling point shift amount 107 that gives the maximum light collection efficiency regarding each sampling point 106 of the CRA characteristic value 101 acquired by the CRA sampling point acquiring unit 102 using an optical simulation, such as ray tracing. The sampling point shift amount calculating unit 103 includes a computer and a computer program to be executed by the computer.

A shift amount characteristic function calculating unit 104 calculates, based on the sampling point shift amounts 107 at a plurality of sampling points calculated by the sampling point shift amount calculating unit 103, a shift amount characteristic function 108 to be approximated by a n-th order function (where, n≧2) corresponding to each embodiment. The shift amount characteristic function calculating unit 104 includes a computer and a computer program to be executed by the computer. The shift amount characteristic function calculating unit 104 receives the sampling point shift amounts 107 as input and calculates a shift amount characteristic function, which is an n-th order function, using, for example, a least square method.

A shift amount calculating unit 105 calculates the shift amount 1209 (see FIGS. 1A and 1B) of the light collecting portion 1210 of a solid-state image pickup element using the shift amount characteristic function 108 calculated by the shift amount characteristic function calculating unit 104. The shift amount calculating unit 105 includes a computer and a computer program to be executed by the computer. The shift amount calculating unit 105 calculates, for each pixel, the shift amount based on the shift amount characteristic function.

In each embodiment, the CRA characteristics of the image pickup lens 1205 (see FIGS. 1A and 1B) may be approximated by the second to fifth order functions. To improve the CRA characteristics based on some actually measured sampling point shift amounts 107, the n-th order shift amount characteristic function to be approximated is calculated. Based on the shift amount characteristic function, the shift amount 1209 (see FIGS. 1A and 1B) of the light collecting portion 1210 of the solid-state image pickup element is optimally calculated at a high speed.

In the first embodiment, a quadratic function f2(r) regarding a distance "r" from the screen center on the two-dimensional plane is given as the shift amount characteristic function calculated by the shift amount characteristic function calculating unit 104.

A given point on the screen, for example, the center of the screen, in the two-dimensional array (see FIG. 3) of the light receiving portions 1202 is set as the origin. When a distance from the origin to the center of the light receiving portion 1202 (see FIGS. 1A and 1B) of each pixel, a distance in the horizontal direction, and a distance in the vertical direction are set as "r", "x", and "y", respectively, Equation (1) is given.

$$r=\sqrt{(x2+y2)} \quad (1)$$

Here, "√" represents a square root of a parenthesized value. An r-direction shift amount dr, an x-direction shift amount dx, and a y-direction shift amount dy may be calculated using Equation (2).

$$dr=f2(r)=a \times r^2 + b \times r$$

$$dx = dr \times x/r = (a \times r + b) \times x$$

$$dy = dr \times y/r = (a \times r + b) \times y \quad (2)$$

Figure 8A:
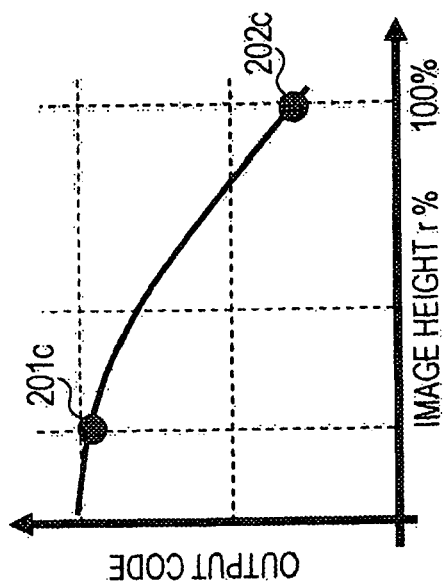

In the first embodiment, the CRA sampling point acquiring unit 102 shown in FIG. 7 receives, for example, sampling points having a characteristics shown in FIG. 8A as the CRA characteristic values 101. The CRA sampling point acquiring unit 102 acquires, as two sampling points 106, a sampling point 201a at a portion where the incident angle monotonically increases with respect to the image height at around the screen center and a sampling point 202a at a portion corresponding to a screen edge.

Figure 8B:
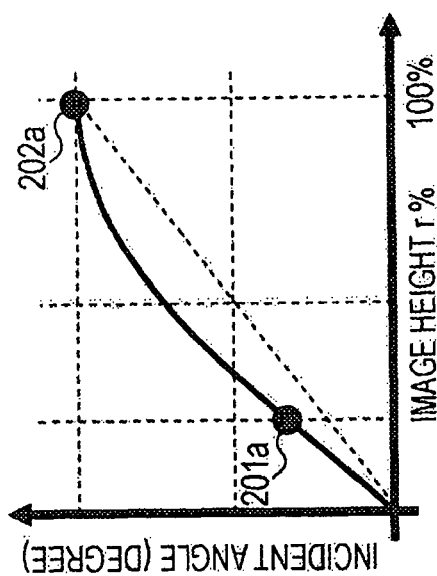

The sampling point shift amount calculating unit 103 determines, with regard to the sampling points 201a and 202a, two points 201b and 202b, shown in FIG. 8B as the sampling point shift amounts 107, that give the maximum light collection efficiency (201c and 202c shown in FIG. 8C, respectively).

The shift amount characteristic function calculating unit 104 calculates, based on the sampling point shift amounts 201b and 202b and the origin (the screen center), the quadratic characteristic function 203 shown in FIG. 8B, for the shift amount characteristic function 108 to be approximated by the quadratic function of Equation (2), using, for example, a least square method to determine coefficients "a" and "b" of Equation (2).

The shift amount calculating unit 105 calculates shift amounts (dr, dx, dy) for each pixel (coordinates thereof=(x, y)) of a solid-state image pickup element using the determined coefficients "a" and "b" and Equation (2). In the first embodiment, the two shift amounts 201b and 202b of the portion 201a where the incident angle monotonically increases with respect to the image height at around the screen center and the portion 202a corresponding to the screen edge are optimized using the quadratic function as shown in FIGS. 8A and 8B, respectively. As shown in FIG. 8C, the shading characteristics are improved.

In a second embodiment, a shift amount characteristic function calculated by the shift amount characteristic function calculating unit 104 is given as a cubic function f3(r) regarding a distance "r" from the screen center on the two-dimensional plane.

An redirection shift amount, an x-direction shift amount, and a y-direction shift amount according to the second embodiment are represented by Equation (3).

$$dr = f3(r) = a \times r^3 + b \times r^2 + c \times r$$

$$dx = dr \times x/r = (a \times r^2 + b \times r + c) \times x$$

$$dy = dr \times y/r = (a \times r^2 + b \times r + c) \times y \quad (3)$$

Figure 9A:
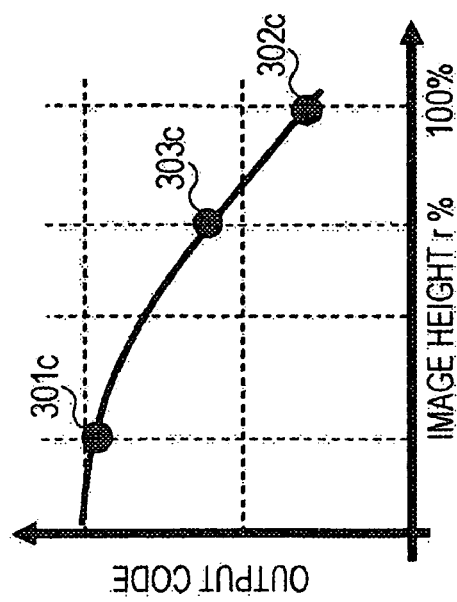
FIG. 9 shows characteristics according to a second embodiment.

In the second embodiment, the CRA sampling point acquiring unit 102 shown in FIG. 7 acquires, as the CRA characteristic values 101, sampling points having a characteristics, for example, shown in FIG. 9A. The CRA sampling point acquiring unit 102 acquires three sampling points 106, namely, a sampling point 301a at a portion where the incident angle monotonically increases with respect to the image height at around the screen center, a sampling point 302a at a portion corresponding to the screen edge, and a sampling point 303a at a portion where the graph gradually curves from the midway of the image height.

Figure 9B:
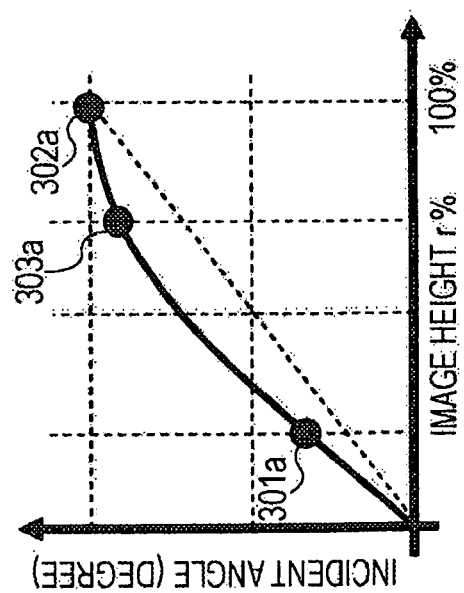
Figure 9C:
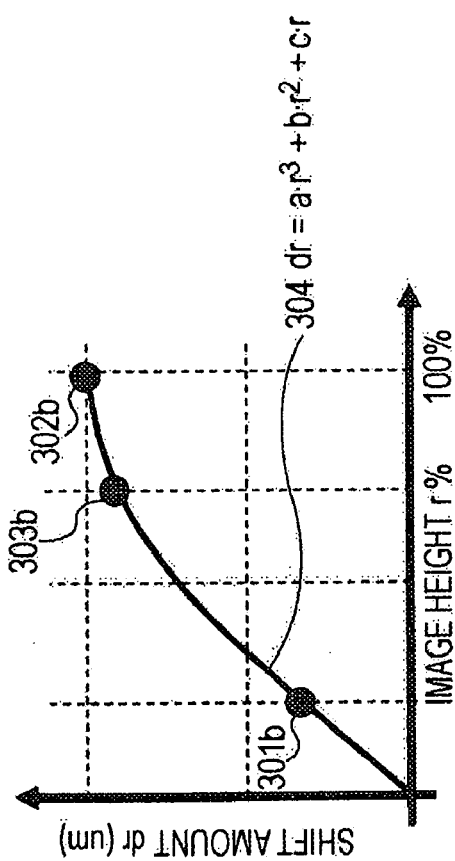

The sampling point shift amount calculating unit 103 determines, regarding the sampling points 301a, 302a, and 303a, three shift amounts 301b, 302b, and 303b shown in FIG. 9B as the sampling point shift amounts 107 that give the maximum light collection efficiency (301c, 302c, and 303c shown in FIG. 9C), respectively.

The shift amount characteristic function calculating unit 104 calculates, as the shift amount characteristic function 108 to be approximated by the cubic function represented by Equation (3), a cubic characteristic function 304 shown in FIG. 9B, based on the origin (screen center) and the sampling point shift amounts 301b, 302b, and 303b, using, for example, a least square method to determine coefficients "a", "b", and "c" of Equation (3).

The shift amount calculating unit 105 calculates a shift amount (dr, dx, dy) of each pixel (coordinates thereof=(x, y)) of a solid-state image pickup device using the determined coefficients "a", "b", and "c" and Equation (3).

In the second embodiment, a middle portion of the image height is coupled smoothly by using the cubic function, whereby the shading characteristics are improved.

In a third embodiment, a quartic function regarding a distance "r" from the screen center on the two-dimensional plane is given as a shift amount characteristic function calculated by the shift amount characteristic function calculating unit 104 shown in FIG. 7.

As shown in FIGS. 2A and 2B, a shape of the opening of the light receiving portion 1202 of the pixel 1301 of the solid-state image pickup element is a rectangle having a longer x-axis-direction edge (horizontal direction in the drawings) and a shorter y-axis-direction edge (vertical direction in the drawings).

Figure 11A:
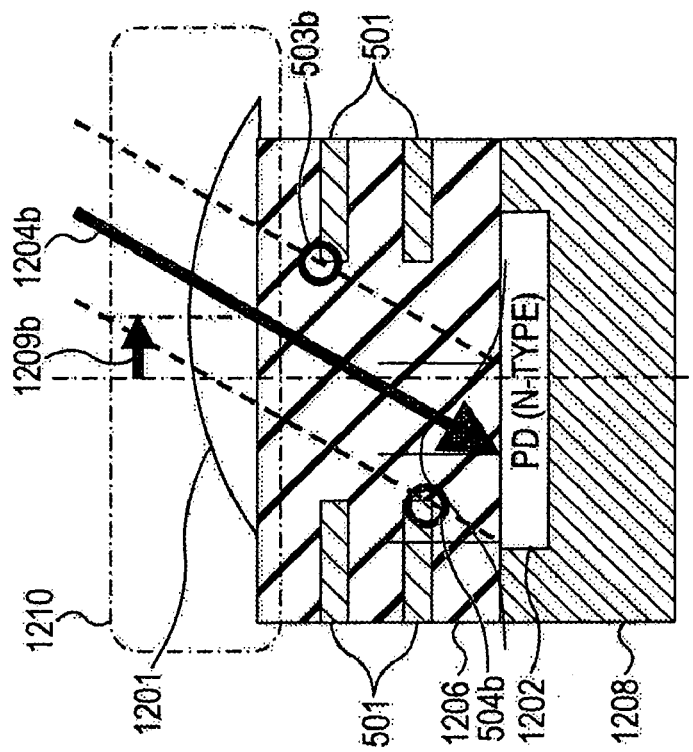
FIG. 11 shows aspects of a third embodiment.

If a cross section of the pixel 1301 having such a shape is viewed from the y-axis direction (direction A shown in FIG. 12), the width of the light receiving portion 1202 looks narrow. As shown in FIG. 11A, a spot of incident light 1204a entering the light receiving portion 1202 is blocked by an upper layer end 503a of a second interconnection layer 502 near the light-entering side and a light receiving portion end 504a on the side opposite to the light-entering side. Accordingly, a shift amount 1209a of the light collecting portion 1210, which includes the microlens 1201, in the y-axis direction has to be large.

Figure 11B:
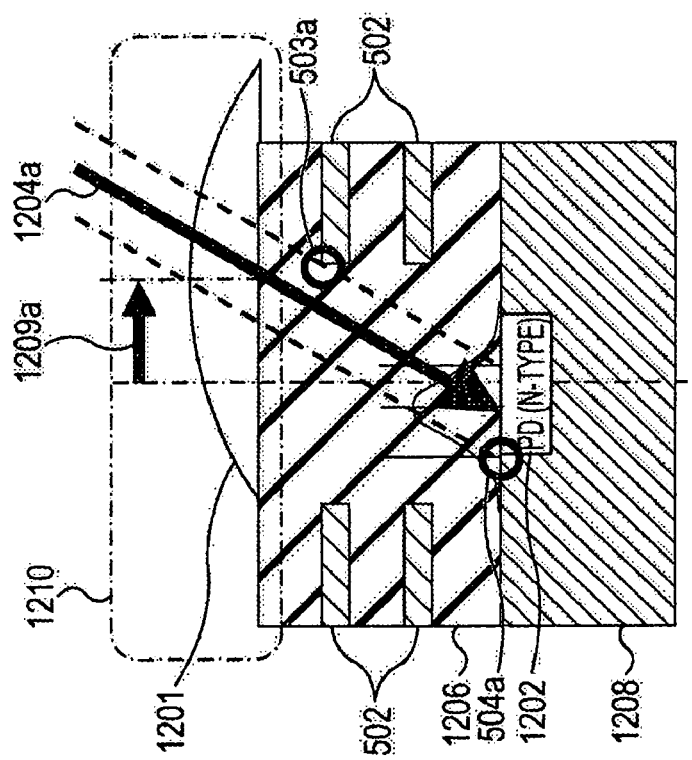

When a cross section of the pixel 1301 is viewed from the x-axis direction (direction B shown in FIG. 12), a width of the light receiving portion 1202 looks wide. As shown in FIG. 11B, the spot of the incident light 1204b reaching the light receiving portion 1202 is blocked by an upper layer end 503b of a first interconnection layer 501 near the light-entering side and a lower layer end 504b of the first interconnection layer 501 on a side opposite to the light-entering side. Accordingly, a shift amount 1209b of the light collecting portion 1210, which includes the microlens 1201, in the x-axis direction may be set small.

In FIGS. 11A and 11B, the on-chip color filter (OCF) 1203 shown in FIGS. 1A and 1B is omitted.

In the third embodiment, it is considered that the width of the opening of the light receiving portion 1202 (see FIGS. 1A and 1B) differs between the x-axis direction and the y-axis direction, and shift amounts 1209 in the respective directions are approximated by different quartic functions f4-1(r) and f4-2(r).

$$dr1 = f4\text{-}1(r) = a1 \times r^4 + b1 \times r^3 + c1 \times r^2 + d1 \times r$$

$$dr2 = f4\text{-}2(r) = a2 \times r^4 + b2 \times r^3 + c2 \times r^2 + d2 \times r$$

$$dx = dr1 \times x/r = (a1 \times r^3 + b1 \times r^2 + c1 \times r + d1) \times x$$

$$dy = dr2 \times y/r = (a2 \times r^3 + b2 \times r^2 + c2 \times r + d2) \times y \quad (4)$$

In the third embodiment, the CRA sampling point acquiring unit 102 shown in FIG. 7 receives, as the CRA characteristic values 101, sampling points having characteristics shown in FIG. 10A, for example. The CRA sampling point acquiring unit 102 acquires, as the sampling points 106, a sampling point 401a at a portion where the incident angle monotonically increases with respect to the image height at around the screen center, a sampling point 402a at a portion corresponding to the screen edge, and two sampling points 403a and 404a at two portions where the graph gradually curves from the midway of the image height.

The sampling point shift amount calculating unit 103 shown in FIG. 7 calculates, with regard to the sampling points 401a, 402a, 403a, and 404a, the sampling point shift amounts 107 that give the maximum light collection efficiency (401c, 402c, 403c, and 404c of FIG. 10C), respectively. More specifically, points 401-1b, 402-1b, 403-1b, and 404-1b (in x-axis direction) and points 401-2b, 402-2b, 403-2b, and 404-2b (in y-axis direction) shown in FIG. 10B are determined separately for the x-axis direction and the y-axis direction, respectively.

The shift amount characteristic function calculating unit 104 shown in FIG. 7 determines, based on the origin (the screen center) and the four x-axis-direction sampling point shift amounts 401-1b, 402-1b, 403-1b, and 404-1b, the values dr1 and dx of Equation (4) and a shift amount characteristic function 108 to be approximated by a quartic function represented as 405-1 in FIG. 10B. The shift amount characteristic function calculating unit 104 also determines, based on the origin (the screen center) and the four y-axis-direction sampling point shift amounts 401-2b, 402-2b, 403-2b, and 404-2b, the values dr2 and dy of Equation (4) and a shift amount characteristic function 108 to be approximated by a quartic function represented as 405-2 in FIG. 10B. The shift amount characteristic function calculating unit 104 determines the coefficients a1, b1, c1, and d1 and the coefficients a2, b2, c2, and d2 using, for example, a least square method.

Using the determined coefficients and Equation (4), the shift amount calculating unit 105 shown in FIG. 7 calculates an x-axis-direction shift amount (dr1, dx) and a y-axis-direction shift amount (dr2, dy) of each pixel (coordinates thereof= (x, y)) of the solid-state image pickup element.

In the third embodiment, by separately applying the quartic functions in the x-axis direction and in the y-axis direction, optimum shading characteristics are obtained. In particular, when the CRA characteristics become substantially horizontal at around the screen edge, the quartic function is required to improve the shading characteristics.

In a fourth embodiment, a shift amount characteristic function calculated by the shift amount characteristic function calculating unit 104 shown in FIG. 7 is given as a quartic function regarding a distance "r" from the screen center on the two dimensional plane, similar to the third embodiment.

Figure 12:
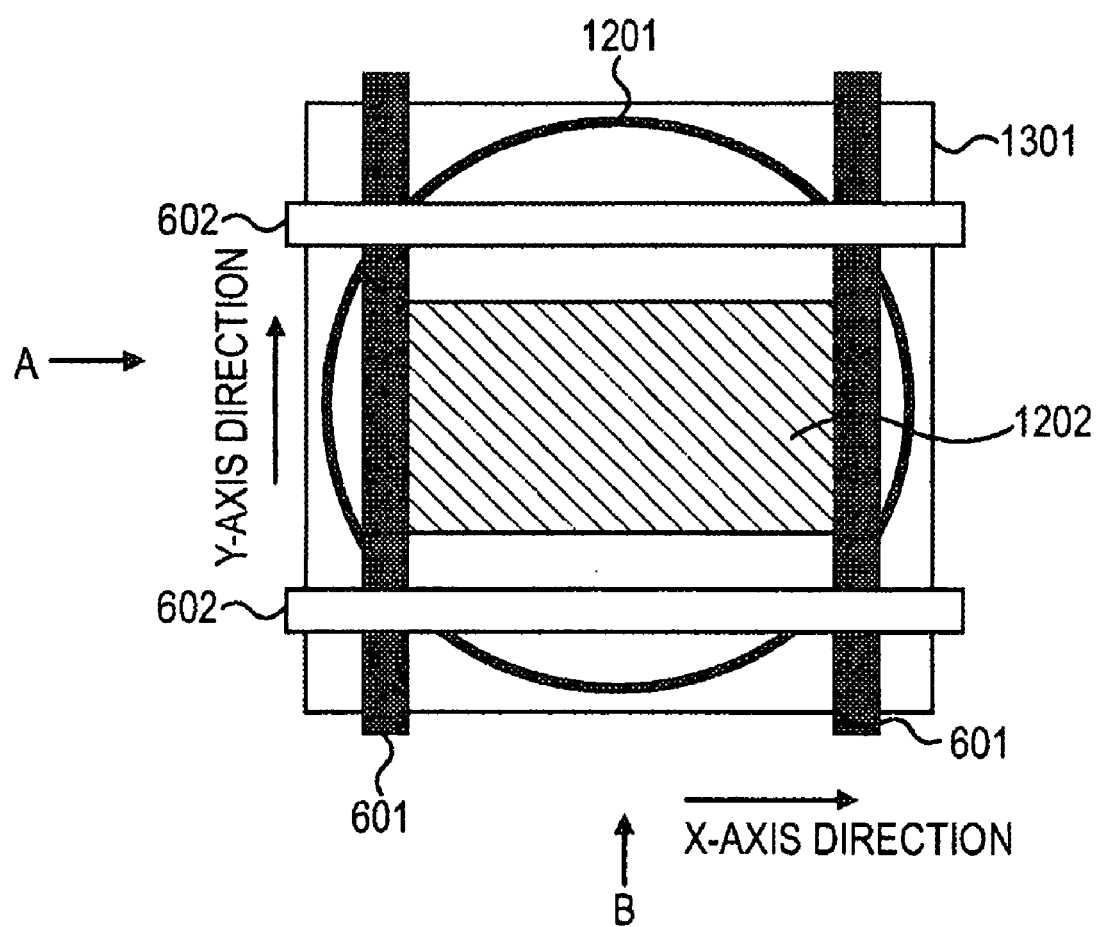
FIG. 12 shows aspects of a fourth embodiment.

As shown in FIG. 12, in the fourth embodiment, a shape of an opening of the light receiving portion 1202 of the pixel 1301 of a solid-state image pickup element is a rectangle having a longer x-axis-direction edge and a shorter y-axis-direction edge, similar to the third embodiment. As shown in FIG. 12, in the fourth embodiment, a first interconnection layer 601 is arranged in the y-axis direction in the inter-layer insulating film 1206 (see FIGS. 1A and 1B) provided on the light receiving portion 1202. A second interconnection layer 602 is arranged above the first interconnection layer 601 in the x-axis direction.

When a cross section of the pixel 1301 having such a shape is viewed in the direction A shown in FIG. 12, the width of the light receiving portion 1202 looks narrow and the position of the second interconnection layer 602 is higher (closer to the microlens 1201). Accordingly, due to the relation between the incident light 1204a and light blocking positions 701a and 702a shown in FIG. 13A, a ratio of shading-causing incident light 1204a reaching the second interconnection layer 602 increases and the opening of the pixel 1301 becomes narrow.

When a cross section of the pixel 1301 is viewed in the direction B shown in FIG. 12, the width of the light receiving portion 1202 looks wide and the position of the first interconnection layer 601 is lower (closer to the light receiving portion 1202). Accordingly, due to the relation between the incident light 1204b and light blocking positions 701b and 702b shown in FIG. 13B, a ratio of shading-causing incident light 1204b reaching the first interconnection layer 601 increases and the opening of the pixel 1301 becomes wide.

The light collection efficiency at the X-axis end is discussed. The incident angle of the light entering in the x-axis direction is large, whereas the length of the light receiving portion 1202 in the x-axis direction is long. Accordingly, a ratio of light entering a wide photodiode does not decrease much compared with the ratio at the center, and the light collection efficiency only slightly decreases (high light collection efficiency is maintained) if the incident angle changes more or less. The light collection efficiency of the light entering in the x-axis direction, in which the length of the light receiving portion 1202 is long, does not change much if the incident angle changes more or less.

The light collection efficiency at the y-axis end is discussed. The length of the light receiving portion 1202 in the y-axis direction is short. Accordingly, a ratio of light entering a narrow photodiode is small if the incident angle of the light entering in the y-axis direction is not large, whereby the light collection efficiency decreases. As shown in FIG. 13A, since the incident light is blocked by the second interconnection layer 602 as the incident angle increases, the light collection efficiency decreases. The light collection efficiency of the light entering in the y-axis direction, in which the length of the light receiving portion 1202 is short, decreases as the incident angle increases. Conversely, the light collection efficiency increases as the incident angle decreases.

The y-axis-direction light collection efficiency is lower than the x-axis-direction light collection efficiency. More specifically, an image in the y-axis direction becomes darker than an image in the x-axis direction. This phenomenon is not unusual for image quality. The luminance in the y-axis direction may be adjusted by a processor, such as a digital circuit.

A position in a direction, such as a diagonal direction, other than the x-axis direction and the y-axis direction will be discussed. For example, a diagonal end (one of four corners) of a screen will be discussed. Suppose that a ratio of a x-axis-direction size to a y-axis-direction size of a screen is set to 4:3, an incident angle (in the diagonal direction) at the image height of 100% (diagonal end of the screen) is equal to 25°, an incident angle (x-axis direction) at the image height of 80% (x-axis end in the screen) is equal to 24°, and an incident angle (in the y-axis direction) at the image height of 60% (the y-axis end in the screen) is equal to 22°. The incident angle is divided into an x-axis-direction component and a y-axis-direction component. The x-axis-direction incident angle component at the diagonal end is equal to $\tan^{-1}(\tan 25° \times 4/\sqrt{(3^2+4^2)})=20.5°$. In addition, the y-axis-direction incident angle component at the diagonal end is equal to $\tan^{-1}(\tan 25° \times 4/\sqrt{(3^2+4^2)})=15.6°$.

The incident angle component in the x-axis direction is equal to 20.5°, which is large. However, the ratio of the light entering a wide photodiode in the x-axis direction does not change and the light collection efficiency does not decrease.

The incident angle component in the y-axis direction is equal to 15.6°, which is smaller than the y-axis-direction incident angle of 22° at the y-axis end. As the incident angle of the light entering in the y-axis direction, in which the length of the light receiving portion 1202 is short, decreases, the light collection efficiency increases.

Figure 14A:
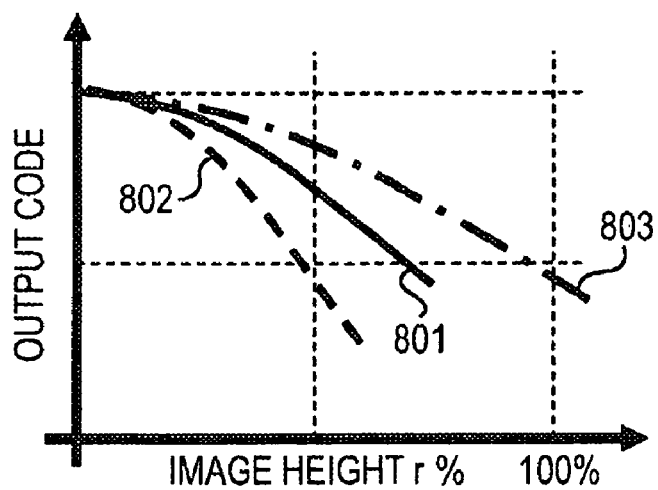
FIG. 14 shows aspects of a fourth embodiment.

AS shown in FIG. 14A, the light collection efficiency is higher at the diagonal end (803 in the drawing) than at the y-axis-direction end (802 in the drawing). The light collection efficiency at the x-axis-direction end (801 in the drawing) indicates a value therebetween.

Figure 14B:
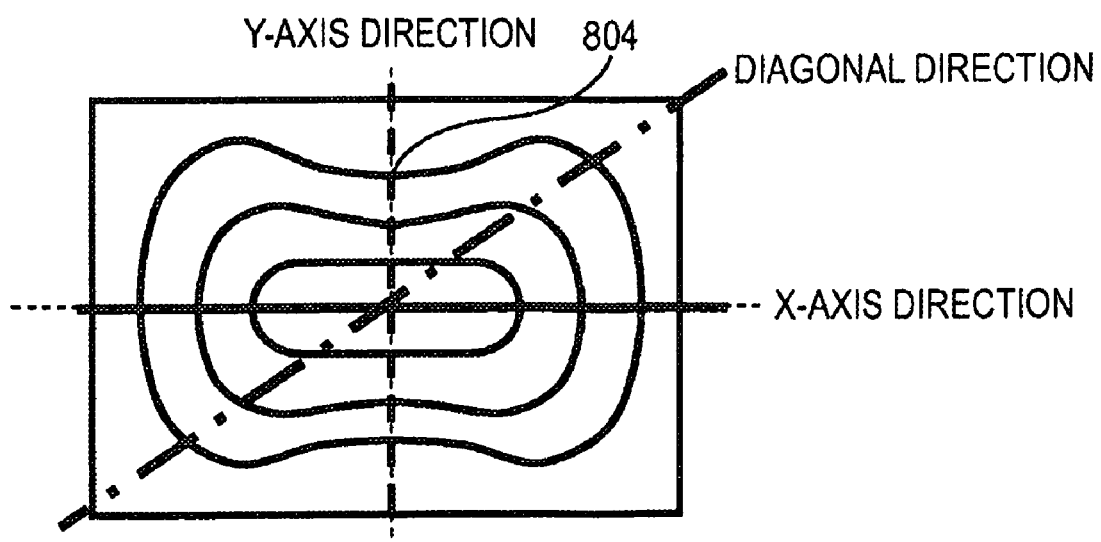

The x-axis-direction and y-axis-direction shift amounts 1209 are calculated using Equation (4) employed in the third embodiment. When an output code of an image obtained by capturing a uniform screen is represented using a contour, the shading characteristics shown in FIG. 14B are obtained. More specifically, shading characteristics showing a bottle gourd whose contour is shrunk only in the y-axis direction (804) and extends in the diagonal and x-axis directions are obtained.

Figure 15A:
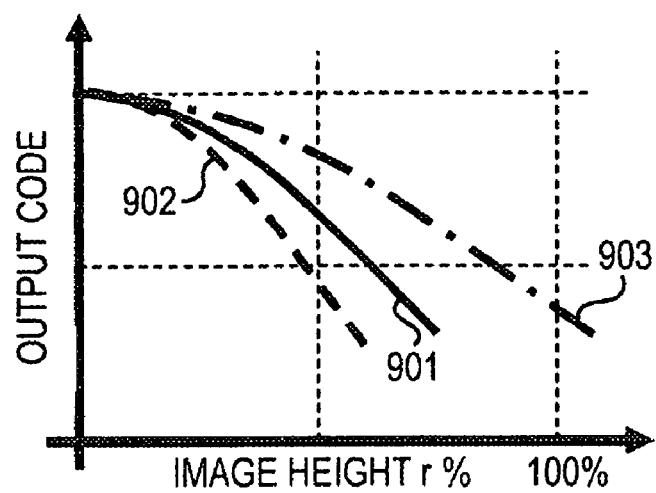
FIG. 15 shows aspects of a fourth embodiment.

As shown by a graph 901 of FIG. 15A, a correction coefficient is multiplied by the y-axis-direction shift amount dy of Equation (4) so that the output code value decreases at a position having a large x coordinate in the x-axis direction, in which the width of the light receiving portion 1202 is long, in the fourth embodiment.

Figure 15B:
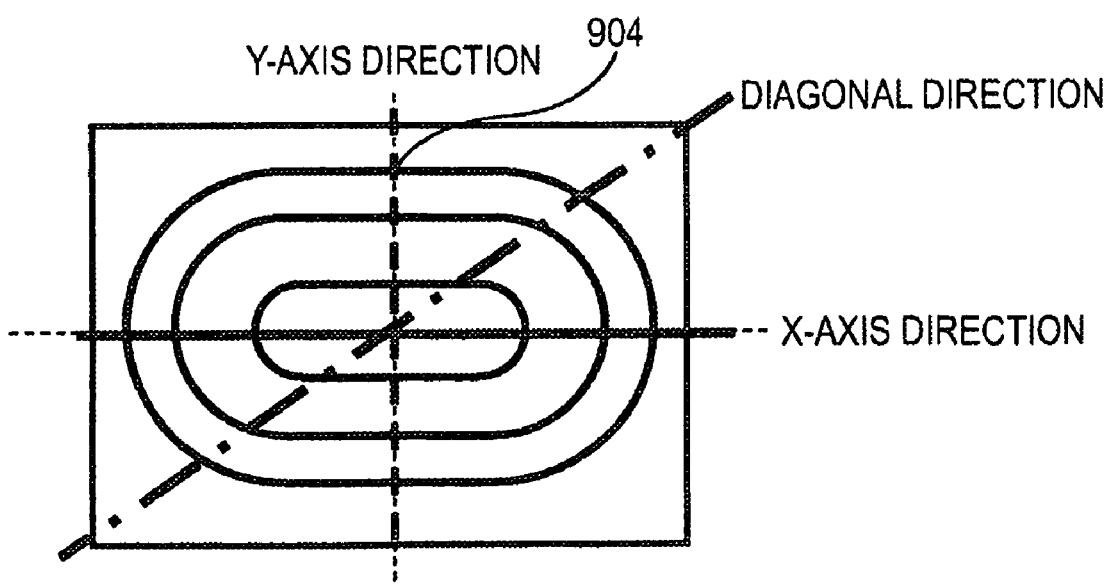

As shown in FIG. 15A, the characteristics in the x-axis direction 901 and in the diagonal direction 903 approach the characteristic in the y-axis direction 902 compared with the characteristics shown in FIG. 14A. As shown by a graph 904 of FIG. 15B, a characteristic wherein the contour of the output code of the image is shrunk in the y-axis direction is prevented and a natural shading characteristic having a concentric ellipse shape is obtained.

As the correction coefficient, for example, $(1+e \times x^2)$ employing a constant coefficient "e" is used. Equation (4) is modified as follows.

$$dr1 = f4-1(r) = a1 \times r^4 + b1 \times r^3 + c1 \times r^2 + d1 \times r$$

$$dr2 = f4-2(r) = a2 \times r^4 + b2 \times r^3 + c2 \times r^2 + d2 \times r$$

$$dx = dr1 \times x/r = (a1 \times r^3 + b1 \times r^2 + c1 \times r + d1) \times x$$

$$dy = dr2 \times y/r = (a2 \times r^3 + b2 \times r^2 + c2 \times r + d2) \times y \times (1 + e \times x^2) \quad (5)$$

The correction coefficient $(1+e \times x^2)$ is determined in consideration with the following points.

1) Since the y-axis-direction light collection efficiency is optimized to be the maximum for the light receiving portion 1202, the y-axis-direction light collection efficiency is employed as it is.

2) Since the y-axis-direction component of the incident angle decreases as a distance from the y axis increases along the x-axis direction, the light collection efficiency increases. To decrease this light collection efficiency, the shift amount 1209 is deviated from the optimized value.

The correction coefficient $(1+e \times x^2)$ employed in Equation (5) satisfies the above-described two points. More specifically, the correction coefficient is a coefficient that is equal to 1 at the x coordinate value of 0 and that increases according to a square of the x coordinate value.

The correction coefficient only has to satisfy the above-described two points. Regarding the shift amount 1209 in a direction (the y-axis direction) along a shorter edge of the light receiving portion 1202, the correction amount is increased as a distance from the center of the two-dimensional array of the light receiving portions 1202 increases toward a longer edge direction (x-axis direction) of the light receiving portion 1202. Coefficients, such as $(1+e \times x^4)$ and $1 \div (1+e \times x^4)$, may offer the similar effects. The order of the correction coefficient may be an odd number, such as $(1+e \times |x|^1)$ and $(1+e \times |x|^3)$. However, the value may be converted into an absolute value so that symmetry is realized on the positive and negative sides of the x axis.

In the fourth embodiment, the CRA sampling point acquiring unit 102 shown in FIG. 7 acquires, as the sampling points 106, four sampling points on the x axis after receiving the CRA characteristic values 101. The sampling point shift amount calculating unit 103 determines, regarding the four sampling points, four x-axis-direction sampling point shift amounts 107 that give the maximum light collection efficiency. The shift amount characteristic function calculating unit 104 calculates, based on the origin (screen center) and the four x-axis-direction sampling point shift amounts, the values dr1 and dx of Equation (5) using, for example, a least square method to determine the coefficients a1, b1, c1, and d1 of Equation (5).

The CRA sampling point acquiring unit 102 shown in FIG. 7 acquires, as the sampling points 106, four sampling points on the y axis after receiving the CRA characteristic values 101. The sampling point shift amount calculating unit 103 determines, regarding the four sampling points, four y-axis-direction sampling point shift amounts 107 that give the maximum light collection efficiency. The shift amount characteristic function calculating unit 104 calculates, based on the origin (the screen center) and the four y-axis-direction sampling point shift amounts, the values dr2 and dy of Equation (5) using, for example, a least square method to determine the coefficients a2, b2, c2, and d2 of Equation (5).

The shift amount calculating unit 105 calculates an x-axis-direction shift amount (dr1, dx) and a y-axis-direction shift amount (dr2, dy) of each pixel (coordinates thereof (x,y)) of the solid-state image pickup element using the determined coefficients and Equation (5).

In the fourth embodiment, the quartic functions are applied in the x-axis direction and in the y-axis direction and the correction coefficient $(1+e \times x^2)$ is introduced, whereby optimum shading characteristics are obtained.

In the fourth embodiment, an expression of the shorter edge and the longer edge of a rectangle is used as directions of the two-dimensional array of the light receiving portion 1202. Not only in a rectangle but also in a ellipse, a hexagon, an octagon, and other figures, such as a convex figure having a partial projection, and if the size of the light receiving portion 1202 differs between in the x-axis direction and in the y-axis direction, the shorter edge and the longer edge may be defined as directions in which the sizes of the light receiving portion 1202 is shorter and longer, respectively.

Figure 16:
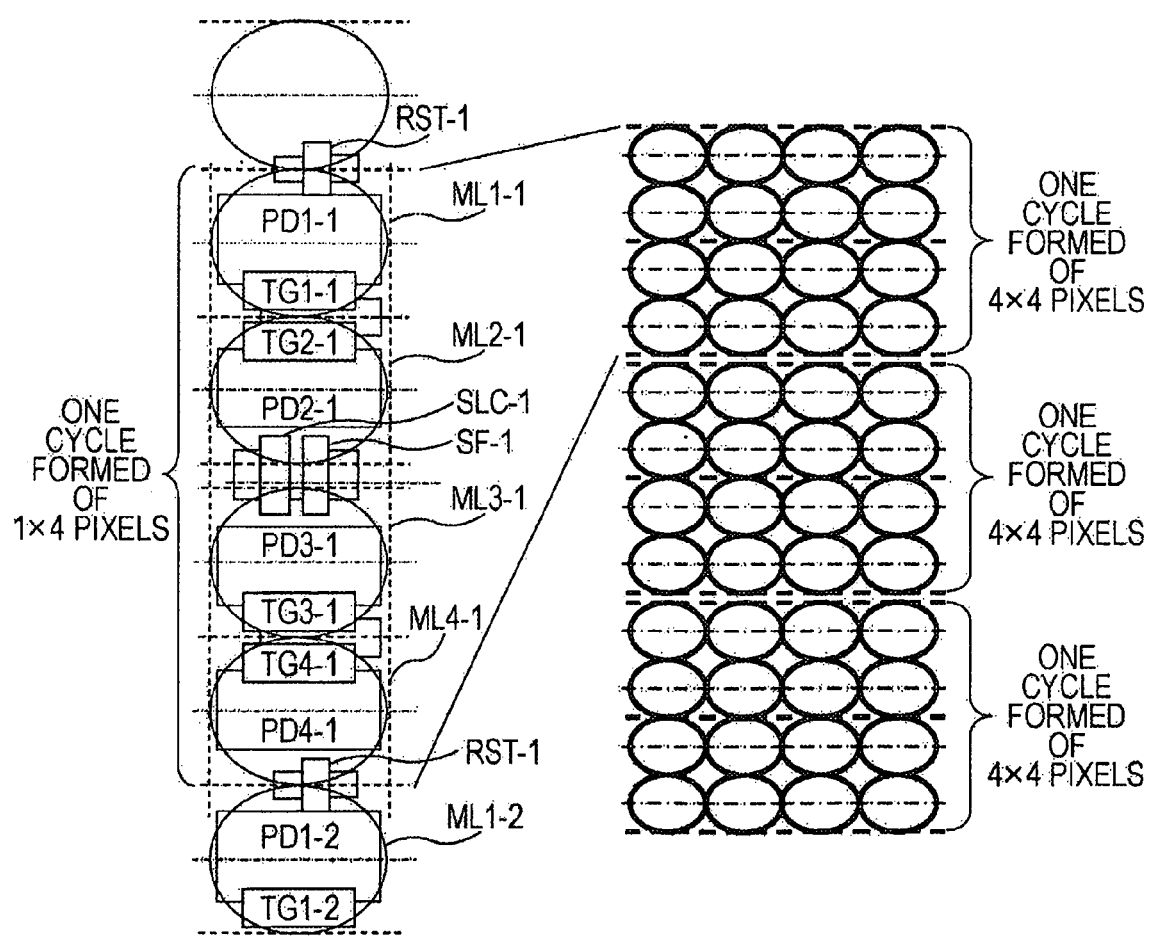
FIG. 16 shows aspects of a fifth embodiment.

As shown in FIG. 16, each pixel of a CMOS image sensor includes transistors, such as a transfer transistor (TG), a reset transistor (RST), a source follower (SF) for amplification, and a line selection transistor (SLC), in addition to the light receiving portion (PD). The ML represents a microlens.

To make a size of the light receiving portion (PD) of one pixel as large as possible, the reset transistor (RST), the amplification source follower (SF), and the line selection transistor (SLC) may be shared by a plurality of pixels. The light receiving portions (PD) are not necessarily arranged at uniform intervals.

In a fifth embodiment shown in FIG. 16, four pixels share the transistors. A large interval of the light receiving portion (PD) is set every four lines and the four lines of light receiving portions (PD) are periodically repeated. The shift amounts 1209 of the microlens may be calculated using Equation (5) of the fourth embodiment. More specifically, the shift amounts dx and dy are calculated from Equation (5) using center coordinates x and y of the light receiving portion (PD) of each pixel.

Figure 17A:
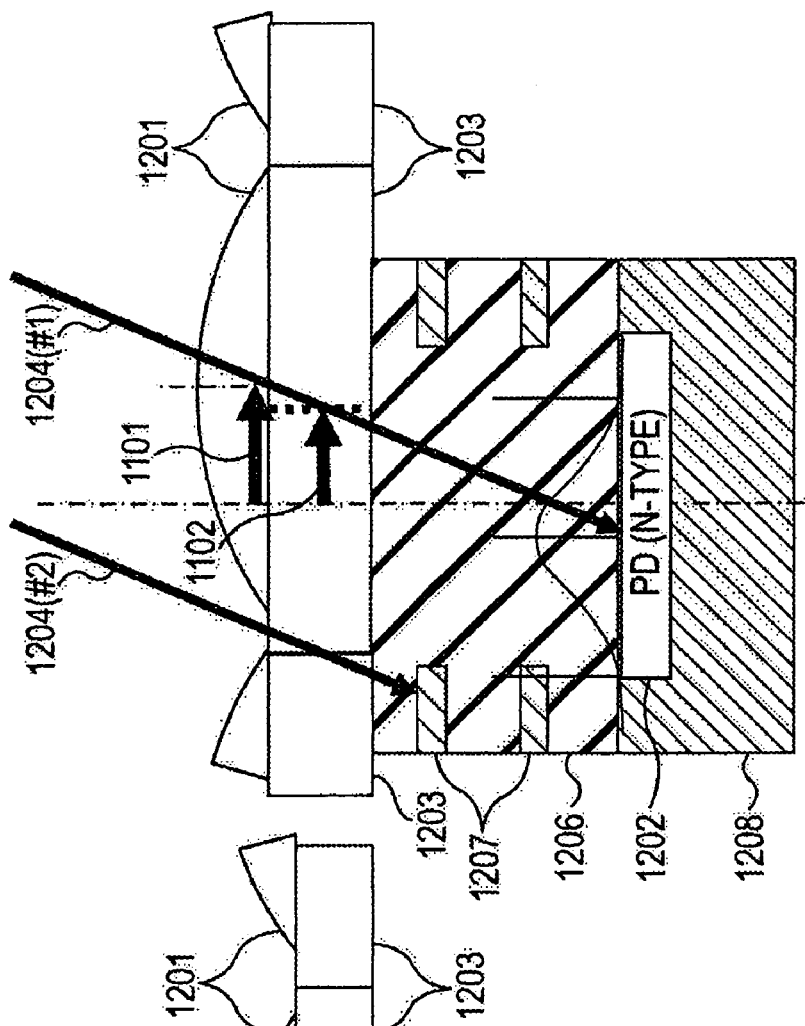
FIG. 17 shows aspects of a sixth embodiment.

As shown in FIG. 17A, a shift amount 1102 of an on-chip color filter (OCF) 1203 is set equal to a shift amount 1101 of a microlens (ML) 1201 in a sixth embodiment.

By setting the shift amount 1101 of the microlens 1201 to match the CRA characteristic of the lens, the shading characteristics are improved. To prevent color mixture, which is caused by the light at a boundary of the microlens 1201 entering the OCF 1203 of a neighboring pixel, the OCF 1203 has to be shifted according to the shift amount 1101 of the microlens 1201. In the sixth embodiment, to set the shift amount 1101 of the microlens 1201 to match the shift amount 1102 of the OCF 1203 on the boundary plane, an identical value is set as the shift amount 1101 of the microlens 1201 and the shift amount 1102 of the OCF 1203 in the sixth embodiment.

Incident light 1204 (#1) passing through the center and a major area of the microlens 1201 reaches the light receiving portion 1202 through the OCF 1203 and the inter-layer insulating film 1206 located immediately under the microlens 1201. Although the incident light 1204 (#2) passing through the peripheral of the microlens 1201 may reach the different-color OCF 1203 of a neighboring pixel when passing through the OCF 1203, this light does not reach the light receiving portion 1202 since the light is blocked or reflected by the interconnection layer 1207. Accordingly, the color mixture is prevented.

In a seventh embodiment, a coefficient of a function that determines the shift amount 1102 of the OCF 1203 differs from a coefficient of a function that determines the shift amount 1101 of the microlens 1201.

When the OCF 1203 is thick, more incident light obliquely crosses the boundary between the OCF 1203 of this pixel and the OCF 1203 of the neighboring pixel. Accordingly, to make the incident light to pass through the thickness-direction center of the OCF 1203, the shift amount 1102 of the OCF 1203 is set smaller than the shift amount 1101 of the microlens 1201.

Figure 17B:
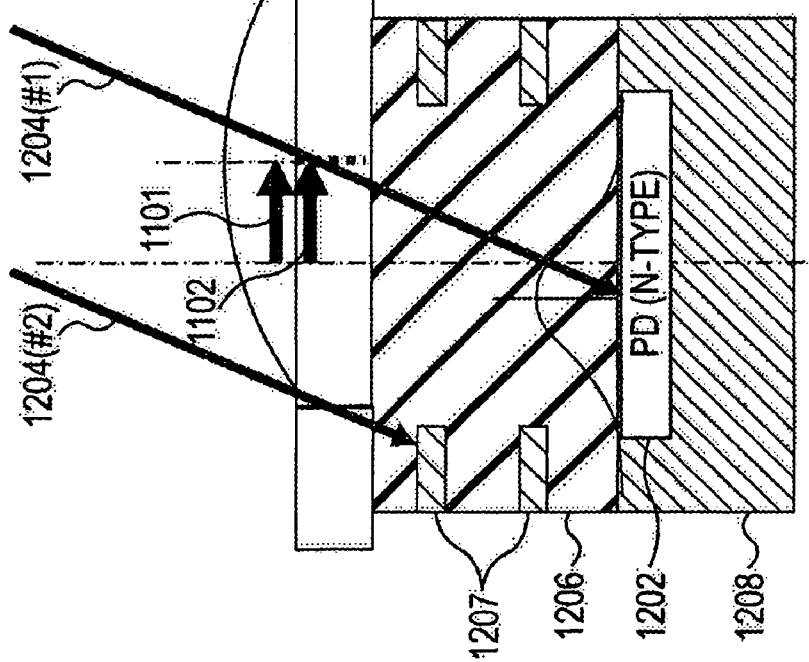

As shown in FIG. 17B, although the incident light 1204 (#2) passing through the periphery of the microlens 1201 may enter the different-color OCF 1203 of a neighboring pixel when passing through the OCF 1203, this light does not reach the light receiving portion 1202 since the light is blocked or reflected by the interconnection layer 1207. In this manner, the color mixture is prevented.

The shift amount 1102 of the OCF 1203 is set to be a multiple of the shift amount 1101 of the microlens 1201 in consideration with the thickness of the OCF 1203.

As in the case of the microlens 1201, the shift amount 1102 of the OCF 1203 may be calculated so that optically simulated light rays do not enter the other OCFs. In addition, coefficients, such as a1-d1, a2-d2, and e, may be calculated with Equation similar to Equation (5) or the like separately from the shift amount 1101 of the microlens 1201.

Although a CMOS sensor is employed as a solid-state image pickup element in the above-described embodiments, other solid-state pickup elements, such as a MOS sensor, a CCD (charge coupled device), and a CMD (charge modulation device), may be employed.

Although the above-described embodiments are illustrated as an apparatus for calculating a shift amount of a light collecting portion (a microlens) or an on-chip color filter, the embodiments may be a solid-state image pickup device having a characteristic of a shift amount calculated by the apparatus, and may be a digital camera and a mobile phone including such a solid-state image pickup device.

Example embodiments of the present invention have now been described in accordance with the above advantages. It will be appreciated that these examples are merely illustrative of the invention. Many variations and modifications will be apparent to those skilled in the art.

The invention claimed is:

1. A method for calculating a shift amount of a microlens from a position of a light receiving element arranged in a pixel of an image pickup element, the microlens directing incident light through an image pickup lens onto the light receiving element, the method comprising:
   acquiring an incident angle characteristic value indicating a relation between an arranged position of the pixel and an incident angle of the incident light to the pixel;
   calculating a sampled shift amount of the microlens from the position of the light receiving element corresponding to the incident angle characteristic value based on light collection efficiency of the incident light;
   approximating the sampled shift amount by a second or higher order function to calculate a shift amount characteristic function indicating a relation between the arranged position and the shift amount; and
   calculating the shift amount of the pixel using the shift amount characteristic function.

2. The method according to claim 1, further comprising:
   calculating the shift amount characteristic function for a breadthwise direction and calculating a shift amount characteristic function for a lengthwise direction of the light receiving element; and
   calculating a shift amount in the breadthwise direction and a shift amount in the lengthwise direction using the respective shift amount characteristic functions.

3. The method according to claim 2, wherein at least one of the shift amount characteristic functions includes a term to be approximated by the second or higher order function and a correction term determined according to a breadthwise position and a lengthwise position of the light receiving element.

4. The method according to claim 1, further comprising:
   calculating a shift amount of an on-chip color filter, arranged adjacent to the microlens, from the position of the light receiving element such that the shift amount of the on-chip color filter is equal to the shift amount of the microlens.

5. The method according to claim 1, further comprising:
   calculating a shift amount of an on-chip color filter, arranged adjacent to the microlens, from the position of the light receiving element such that the shift amount of the on-chip color filter includes a predetermined relation with the shift amount of the microlens.

6. An image pickup element for receiving incident light through an image pickup lens with a light receiving element and for converting the received light into an image signal, the image pickup element comprising:
   a microlens that collects the incident light,
   wherein the microlens is shifted from a position of the light receiving element based on an incident angle characteristic indicating a relation between an arranged position of the light receiving element and an incident angle of the incident light to the light receiving element,
   wherein a shift amount characteristic function, indicating a relation between the arranged position and the shift amount, is calculated by approximating a sampled shift amount of the microlens from the position of the light receiving element corresponding to an incident angle characteristic value using a second or higher order function, the sampled shift amount being calculated based on light collection efficiency of the incident light.

7. The image pickup element according to claim 6, wherein the shift amount characteristic function is calculated for a breadthwise direction and for a lengthwise direction of the light receiving element, and wherein a shift distance in the breadthwise direction and a shift distance in the lengthwise direction are calculated using the shift amount characteristic functions respectively.

8. The image pickup element according to claim 7, wherein at least one of the shift amount characteristic functions includes a term to be approximated by a second or higher order function and a correction term determined according to a breadthwise position and a lengthwise position of the light receiving element.

9. The image pickup element according to claim 6, further comprising: an on-chip color filter arranged adjacent to the microlens, wherein a shift amount between the on-chip color filter and the light receiving element is equal to a shift distance between the microlens and the light receiving element.

10. The image pickup element according to claim 6, further comprising: an on-chip color filter arranged adjacent to the microlens, wherein a shift amount between the on-chip color filter and the light receiving element includes a predetermined relation with a shift distance of the microlens.

11. An image pickup element for receiving incident light from an image pickup lens with a plurality of light receiving elements arranged like an array and for converting the received light into an image signal, the image pickup element comprising:
a plurality of microlenses, each of which collects the incident light onto the respective light receiving elements,
wherein each microlens is shifted from a position of the respective light receiving element by a predetermined shift amount, and wherein the predetermined shift amount is determined with a second or higher order function for an arranged position of the respective light receiving element.

12. The image pickup element according to claim 11, wherein the second or higher order function is calculated based on a sampled shift amount of the microlens from the position of the light receiving element corresponding to an incident angle characteristic value, the sampled shift amount being calculated based on light collection efficiency of the incident light.

13. The image pickup element according to claim 12, wherein a breadthwise-direction shift amount for a breadthwise direction of the light receiving element and a lengthwise-direction shift amount for a lengthwise direction of the light receiving element are calculated using the second or higher order functions.

14. The image pickup element according to claim 13, wherein at least one of the second or higher order functions for the breadthwise direction and for the lengthwise direction of the light receiving element includes a term to be approximated by a second or higher order function and a correction term determined according to a breadthwise position and a lengthwise position of the light receiving element.

15. The image pickup element according to claim 11, further comprising:
an on-chip color filter arranged adjacent to the microlens, wherein a shift amount between the on-chip color filter and the light receiving element is equal to the shift amount between the microlens and the light receiving element.

16. The image pickup element according to claim 11, further comprising:
an on-chip color filter arranged adjacent to the microlens, wherein a shift amount between the on-chip color filter and the light receiving *element* includes a predetermined relation with the shift amount of the microlens.

* * * * *